United States Patent
Fujita et al.

(10) Patent No.: US 6,500,011 B1
(45) Date of Patent: Dec. 31, 2002

(54) FLEXURE BLANK AND METHOD OF MANUFACTURING THE SAME

(75) Inventors: Norimasa Fujita, Ushiku (JP); Akira Tadakuma, Inashiki-gun (JP); Yasuji Takagi, Ebina (JP); Ichiro Takadera, Sumida-ku (JP); Akira Nojima, Aikou-gun (JP); Masashi Shiraishi, Kitasaku-gun (JP); Takeshi Wada, Saku (JP)

(73) Assignee: Nippon Mektron, Ltd., Tokyo (JP)

( * ) Notice: Subject to any disclaimer, the term of this patent is extended or adjusted under 35 U.S.C. 154(b) by 0 days.

(21) Appl. No.: 09/513,353

(22) Filed: Feb. 25, 2000

(30) Foreign Application Priority Data

Feb. 26, 1999 (JP) .......................................... 11-049760

(51) Int. Cl.$^7$ .............................................. H01R 12/00
(52) U.S. Cl. ..................... 439/82; 439/931; 174/262; 174/264; 174/265; 174/266; 29/852
(58) Field of Search .................. 439/82, 931; 174/262, 174/264, 265, 266; 29/852

(56) References Cited

U.S. PATENT DOCUMENTS

| | | | | |
|---|---|---|---|---|
| 5,160,579 A | * | 11/1992 | Larson | 29/852 |
| 5,309,632 A | * | 5/1994 | Takahashi et al. | 174/266 |
| 6,035,527 A | * | 3/2000 | Tamm | 29/852 |

* cited by examiner

*Primary Examiner*—Tho D. Ta
(74) *Attorney, Agent, or Firm*—Alix, Yale & Ristas, LLP

(57) ABSTRACT

An opening portion is provided in a connecting portion of a flexure blank, an opening end portion of an insulating base layer is coated with a conductive member without exposing the opening end portion of the insulating base layer in the connecting portion, and a lower surface of the conductive member of the opening portion in the connecting portion of the flexure blank is structured such as to form the same surface as the lower surface of the insulating base layer.

4 Claims, 2 Drawing Sheets

FLEXURE BLANK AND METHOD OF MANUFACTURING THE SAME

BACKGROUND OF THE INVENTION

1. Field of the Invention

The present invention relates to a flexure bland for constructing a suspension for a circuit wire integrated type magnetic head and a method of manufacturing the same, and particularly to a flexure blank structured such as to be electrically connected with a relay flexible circuit board for connecting to an external circuit in a reliable manner, and a method of manufacturing the same.

2. Description of the Related Art

This kind of suspension for the circuit wire integral type magnetic head is constituted by a load beam and a flexure blank, and the flexure blank is connected to an external circuit via the relay flexible circuit board.

FIG. 2 is a cross sectional view which shows a schematic arrangement of the connecting portion of the flexure blank mentioned above and the relay flexible circuit board. A terminal portion or the connecting portion of the conventional flexure blank is structured such that an opening portion 22 for connection is provided at a predetermined position of an insulating base layer 20 made of a polyimide resin or the like, a conductive layer 23 made of a copper or the like and including a predetermined circuit wire pattern is formed on an upper surface of the insulating base layer 20 in such a manner as to surround the opening portion 22, and as shown in FIG. 2, an anticorrosive conductive layer 25 made of a gold or the like is formed on an upper surface of the conductive layer 23 in this connecting portion via a barrier conductive layer 24 made of a nickel or the like.

The conductive layer 23, the barrier conductive layer 24 and the anticorrosive conductive layer 25 mentioned above can be formed in accordance with an additive method such as an electrolytic plating or the like, and this kind of flexure blank is coated with a surface protecting layer 26 made of a polyimide resin or the like including the circuit wire pattern in such a manner as to properly expose the connecting portion mentioned above.

However, in accordance with the structure of the connecting portion of the flexure bland mentioned above, there is a case that an end portion 21 of the insulating base layer 20 positioned at the opening portion 22 for connection protrudes and is formed so as to fringe the conductive layer 23, the barrier conductive layer 24 and the anticorrosive conductive layer 25 in the opening portion 22.

As mentioned above, when the end portion 21 of the insulating base layer 20 protrudes to the opening portion 22 for connection, there is generated a case that a solder is neither sufficiently applied nor expended to a whole of the connecting portion constituted by the conductive layer 23, the barrier conductive layer 24 and the anticorrosive conductive layer 25 and an electric connection can not reliably performed since a wetting property of a solder 29 is bad in the protruding end portion 21 of the insulating base layer 20 in the case of bringing the relay flexible circuit board for connecting to the external circuit in which a predetermined circuit wire pattern 28 is formed on an upper surface of the insulating base member 27 into contact with the opening portion 22 in the connecting portion of the flexure blank mentioned above by using the solder 29 in the manner shown by an arrow.

SUMMARY OF THE INVENTION

Accordingly, the present invention provides a flexure blank having a connecting portion which can be electrically connected to a relay flexible circuit board for connecting to an external circuit in a reliable manner, and a method of manufacturing the same.

In accordance with the present invention, there is provided a flexure blank of a suspension for a circuit wire integral type magnetic head which is electrically connected to a relay flexible circuit board for connecting to an external circuit, wherein an opening portion is provided in a connecting portion of the flexure blank, and an opening end portion of an insulating base layer is coated with a conductive member without exposing the opening end portion of the insulating base layer in the connecting portion.

In this case, a lower surface of the conductive member of the opening portion in the connecting portion of the flexure blank can be structured such as to form the same surface as the lower surface of the insulating base layer, and the lower surface of the conductive member of the opening portion in the connecting portion can be constructed by a grounding conductive layer made of a chrome.

Then, the flexure blank of this kind can be manufactured in accordance with steps of forming an insulating base layer in a pattern which can form an opening portion necessary for a connection with a relay flexible circuit board used for connecting to an external circuit, on an upper surface of a spring metal layer, at least forming a grounding conductive layer which has an improved solder wetting property and is not corroded by an etching fluid in an etching step with respect to an unnecessary portion of the spring metal layer, on a surface of the insulating base layer and a surface area of an exposed spring metal layer by sputtering means, next, forming a plating resist pattern at a position of forming the opening portion on the surface of the grounding conductive layer, successively forming a desired conductive layer and anticorrosive conductive layer in the connecting portion by electrolytic plating means at a stage of forming the other plating resist patterns in accordance with a pattern which can form the connecting portion, thereafter, peeling and removing the plating resist pattern, further, etching and removing an unnecessary area of the grounding conductive layer so as to form the connecting portion, thereafter, peeling and removing the etching resist pattern which becomes unnecessary at the etching process so as to form the opening portion in the connecting portion, next, etching and removing an unnecessary area of the spring metal layer including the connecting portion, and finally etching and removing an area of the grounding conductive layer which is exposed to the opening portion so as to form a penetrating opening portion in the connecting portion.

In this case, at a stage of etching and removing the unnecessary area of the grounding conductive layer so as to form the connecting portion, it is possible to form a surface protecting layer in such a manner as to properly expose the connecting portion including the other circuit wire pattern, and the grounding conductive layer can be formed by a sputtering using a chrome.

DESCRIPTION OF THE PREFERRED EMBODIMENT

A description will be in detail given below of the present invention with reference to an illustrated embodiment.

FIGS. 1a to 1e are schematic views which show a manufacturing step for manufacturing a flexure blank in accordance with the present invention, in these drawings, a connecting portion in the flexure blank will be schematically illustrated.

Figure 1A:
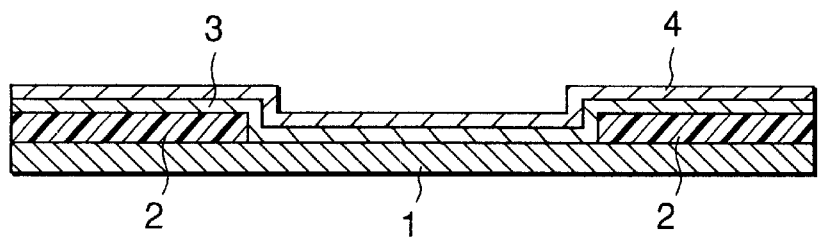
FIGS. 1a to 1e are schematic views which show a manufacturing step for manufacturing a flexure blank in accordance with the present invention.

At first, as shown in FIG. 1a, the steps are constituted by forming an insulating base layer 2 made of a polyimide resin on an upper surface of a spring metal layer 1 made of a stainless steel in accordance with a pattern which can form an opening portion necessary for a connection with a relay flexible circuit board which is used for connecting to an external circuit, uniformly forming a grounding conductive layer 3 made of a chrome or the like which has an improved solder wetting property and is not corroded by an etching fluid at an etching process with respect to an unnecessary portion of the spring metal layer 1, on a surface of the insulating base layer 2 and a surface area of an exposed spring metal layer 1 by sputtering means, and further, forming a conductive layer 4 made of a copper or the like on a surface of the grounding conductive layer 3 by the same sputtering means.

Figure 1B:
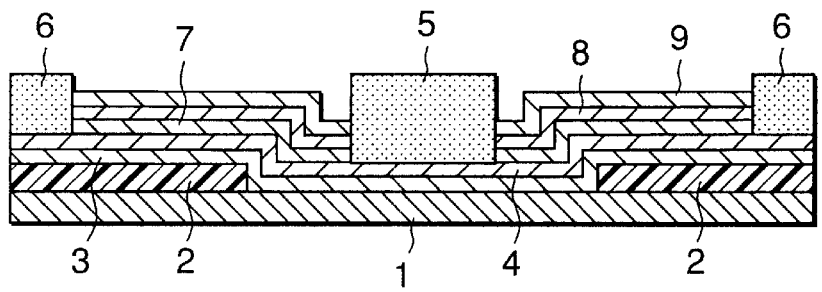

Then, as shown in FIG. 1b, the steps are further constituted by forming a plating resist pattern 5 at a position of forming the opening portion on the surface of the conductive layer 4, successively forming a conductive layer 7 made of a copper or the like, a barrier conductive layer 8 made of a nickel or the like and an anticorrosive conductive layer 9 made of a gold or the like by electrolytic plating means at a stage of forming the other plating resist patterns 6 in accordance with a pattern which can form the connecting portion in accordance with an application of a liquid resist, a drying process and an exposing and developing process, respectively.

Figure 1C:
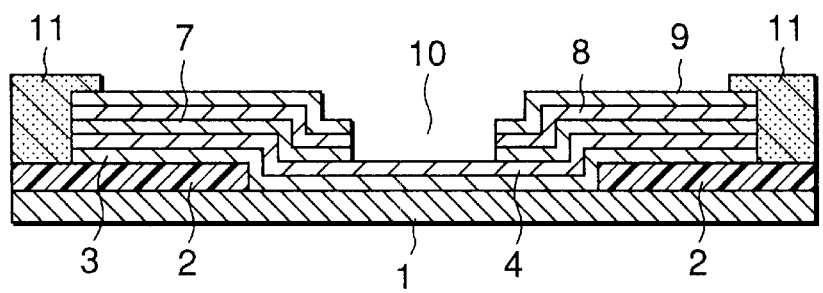

Next, after peeling and removing the plating resist patterns 5 and 6, the steps are constituted by etching and removing an unnecessary area of the conductive layer 4 formed by the sputtering means and an unnecessary area of the grounding conductive layer 3 respectively using a suitable acid and using an alkaline fluid such as a potassium ferricyanide or the like by slight etching means in a state of forming the etching resist pattern at a portion where the plating resist pattern 5 is peeled and removed, so as to form the connecting portion, and peeling and removing the etching resist pattern which becomes unnecessary, whereby the opening portion 10 is formed in the portion as shown in FIG. 1c. Then, as shown in FIG. 1c, a surface protecting layer 11 is formed by using a polyimide resin or the like together with the other circuit wire patterns in an aspect of properly exposing the connecting portion formed in the above steps.

Figure 1D:
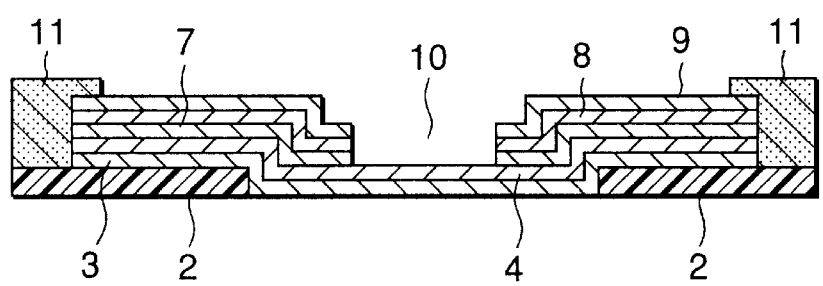

Next, when etching and removing the area of the exposed spring metal layer 1 at a stage of forming the etching resist in a pattern which can remove a whole of an upper surface of the connecting portion formed in the step shown in FIG. 1c and the unnecessary area on an outer surface of the spring metal layer 1, the area of the spring metal layer 1 in the connecting portion of the flexure blank is also removed at the same time as shown in FIG. 1d. Since the grounding conductive layer 3 is formed by the member such as a chrome or the like, the portions of the grounding conductive layer 3 and the conductive layer 4 which are positioned in the opening portion 10 are not etched and removed at this etching process, whereby the lower surface to which the grounding conductive layer 3 is exposed becomes the same surface as the lower surface of the insulating base layer 2.

Figure 1E:
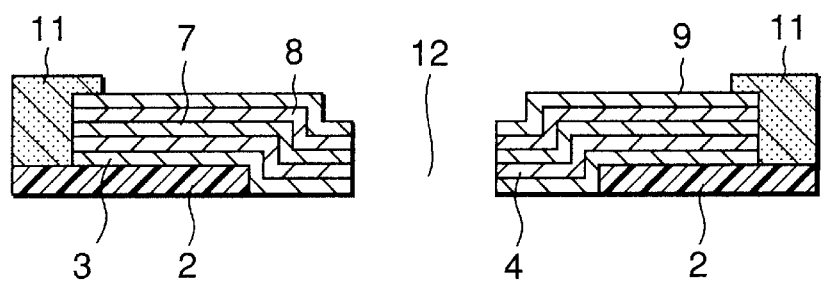
Figure 2:
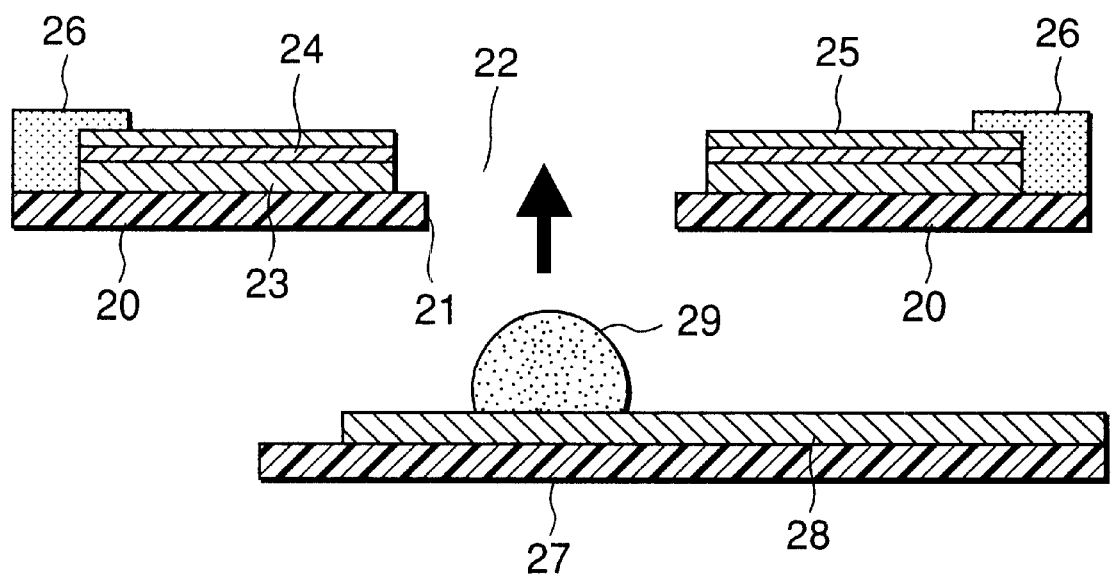
FIG. 2 is a cross sectional view which shows a schematic arrangement of a connecting portion of a flexure blank and a relay flexible circuit board in accordance with a conventional art.

Then, by applying a slight etching process to the area of the conductive layer 4 and the grounding conductive layer 3 which are positioned in the opening portion 10 respectively by using the acid and alkaline fluid as shown in FIG. 1e after peeling and removing the etching resist, it is possible to form a penetrating opening portion in the connecting portion.

In accordance with the flexure blank obtained by the step shown in FIG. 1e, since the opening end portion of the insulating base layer 2 in the connecting portion having the opening portion 12 which is connected to the relay flexible circuit board for connecting to the external circuit is coated with the conductive layer including the grounding conductive layer 3 without exposing and the opening end portion of the opening portion 12 is substantially constructed by the conductive member, the solder is directly brought into contact with the conductive member at a time of connecting to the relay flexible circuit board so as to improve the solder wetting property, so that it is possible to electrically connect the connecting portion of the flexure blank to the relay flexible circuit board in a reliable manner.

In accordance with the flexure blank and the method of manufacturing the same of the present invention, since the structure can be made such as to securely cover the opening end portion of the insulating base layer by the conductive member without exposing the opening end portion of the insulating base layer to the end portion of the opening portion in the connecting portion of the flexure blank, the solder is directly brought into contact with the conductive member at a time of connecting to the relay flexible circuit board for connecting to the external circuit so as to improve the solder wetting property, so that it is possible to properly solve the problem of a poor soldering connection in the conventional art so as to electrically connect the connecting portion of the flexure blank having the structure mentioned above to the relay flexible circuit board in a reliable manner.

Further, since the lower surface of the conductive member of the opening portion in the connecting portion of the flexure blank is formed in the same surface as the lower surface of the insulating base layer, it is possible to closely attach to the relay flexible circuit board so as to obtain an electrically and mechanically reliable mutual connection.

What is claimed is:

1. A flexure blank of a suspension for a circuit wire integral type magnetic head which is electrically connected to a relay flexible circuit board for connecting to an external circuit comprising:

an insulating base having an opening, the base having an upper and lower face and said opening having an edge;

a ground conductive layer deposited on the upper face and circumferentially covering the edge of the insulating base opening;

a conductive layer deposited on top of the ground conductive layer;

a barrier-conductive layer deposited on top of the conductive layer;

an anti-corrosion conductive layer deposited on top of the barrier-conductive layer; and means defining an opening portion passing through the opening in the base, wherein the opening portion is spaced from the base edge and is further partially defined by each of said ground conductive layer, conductive layer, barrier-conductive layer and anti-corrosion conductive layer, such that each of said layer is exposed by the opening portion.

2. A flexure blank as claimed in claim 1, wherein a lower surface of the conductive member of the opening portion in said connecting portion is constructed by a grounding conductive layer made of a chrome.

3. A flexure blank as claimed in claim 1, wherein a lower surface of the conductive member of the opening portion in the connecting portion of said flexure blank is structured such as to form the same surface as the lower surface of said insulating base layer.

4. A flexure blank as claimed in claim 3, wherein a lower surface of the conductive member of the opening portion in said connecting portion is constructed by a grounding conductive layer made of a chrome.

* * * * *